United States Patent [19]

Okamoto

[11] Patent Number: 5,512,498
[45] Date of Patent: Apr. 30, 1996

[54] METHOD OF PRODUCING SEMICONDUCTOR DEVICE

[75] Inventor: Yutaka Okamoto, Tokyo, Japan

[73] Assignee: Sony Corporation, Tokyo, Japan

[21] Appl. No.: 378,385

[22] Filed: Jan. 25, 1995

[30] Foreign Application Priority Data

Jan. 28, 1994 [JP] Japan .................. 6-007963

[51] Int. Cl.⁶ .................. H01L 21/265
[52] U.S. Cl. ............. 437/35; 437/27; 437/57
[58] Field of Search .......... 437/57, 35, 37, 437/44, 45, 38, 36, 27, 931

[56] References Cited

U.S. PATENT DOCUMENTS

| | | | |
|---|---|---|---|
| 4,232,439 | 11/1980 | Shibata | 437/35 |
| 5,183,768 | 2/1993 | Kameyama et al. | 437/35 |
| 5,355,006 | 10/1994 | Iguchi | 437/35 |
| 5,444,007 | 8/1995 | Tsuchiaki | 437/35 |

FOREIGN PATENT DOCUMENTS

| | | |
|---|---|---|
| 2-306624 | 12/1990 | Japan . |
| 4-14841 | 1/1992 | Japan ............. 437/35 |
| 5-6902 | 1/1993 | Japan . |
| 5-267337 | 10/1993 | Japan ............. 437/35 |
| 6-125046 | 6/1994 | Japan ............. 437/35 |

*Primary Examiner*—George Fourson
*Assistant Examiner*—S. Mulpuri
*Attorney, Agent, or Firm*—Hill, Steadman & Simpson

[57] ABSTRACT

A method of producing a semiconductor device, comprising the following steps: (1) providing a patterned resist mask over a semiconductor substrate, the resist mask being formed with a first opening portion having a first aspect ratio, and a second opening portion having a second aspect ratio larger than the first aspect ratio; (2) forming an impurity diffusion layer by an oblique ion-implantation of impurity ion into a surface of the semiconductor substrate through the second opening portion at an implantation angle to prevent the impurity ion from reaching a bottom surface of the second opening portion; and (3) ion-implanting impurity ion from substantially vertical angle to the semiconductor substrate by using the resist mask.

9 Claims, 8 Drawing Sheets

P WELL CONTACT FORMATION REGION    P CHANNEL ELEMENT FORMATION REGION

METHOD OF PRODUCING SEMICONDUCTOR DEVICE

BACKGROUND OF THE INVENTION

1. Field of the Invention

This invention relates to improvements in a method of producing semiconductor devices upon using a resist mask to accomplish a plurality of ion implantations (employed, for example, in production of semiconductor memories such as CMOS and DRAM), more particularly to such a semiconductor device production method in which the number of steps for forming resist masks can be considerably reduced by virtue of using an oblique ion implantation through a relatively small opening portion formed in the resist mask.

2. Description of the Related Art

Hitherto a variety of production methods for semiconductor devices have been proposed and put into practical use. In a typical one of them, in order to form a well, a channel stop or the like in a semiconductor substrate, a region different in conductivity type from the well is wholly covered with a resist mask, upon which ion implantation is carried out. Additionally in order to form a source and a drain in the well, another resist mask is newly patterned, upon which a high concentration doping is carried out. The reason why the resist mask is thus changed is that a connected section (high concentration impurity layer) is formed in the region different in conductivity from the well simultaneously with the formation of the source drain under an ion implantation. The connected section is for potential fixture.

Such a production method of the semiconductor device will be discussed with reference to FIGS. 6A to 8C.

First, as shown in FIG. 6A, LOCOS oxide films 2A, 2B are formed at an element separation region of the surface of a N-type silicon substrate by using a known selective oxidizing technique. The LOCOS oxide films 2A, 2B have a film thickness of, for example, 400 nm and a width set to be larger in the LOCOS oxide film indicated by the reference numeral 2A than that in the LOCOS oxide film indicated by the reference numeral 2B. Subsequently, thin oxide films 3A, 3B having a thickness of about 16 nm are formed on the surface of the silicon substrate 1. Then, a polysilicon film doped with phosphorous is formed on the whole surface to have a thickness of, for example, 300 nm, upon which a gate polysilicon electrode 4 is patterned by using a photolithography technique or a dry: etching technique.

Subsequently, as shown in FIG. 6B, a N channel element formation region is exposed to form a NMOS transistor, and then a resist mask 5A covering the P channel element formation region is patterned. Thereafter, boron (B) is ion-implanted through the LOCOS oxide film 2A, 2B and the gate polysilicon electrode 4 thereby to form a P well.

Next, as shown in FIG. 6C, boron (B) is similarly ion-implanted through the LOCOS oxide film 2A, 2B and the gate polysilicon electrode 4 thereby forming a N channel stop 7. Further, ion implantation of boron (B) for $V_{th}$ control is similarly made by using the resist mask 5A thereby forming a $V_{th}$ control layer 8 as shown in FIG. 7A.

Thus, in the above technique, the P well 6, the N channel stop 7 and the Vth control layer 8 are successively formed under ion implantation conditions by using the common resist mask 5A. It is to be noted that the above-discussed three ion implantations may be made before the film formation of the gate polysilicon electrode 4.

Thereafter, as shown in FIG. 7B, the resist mask 5A is stripped, and then a new resist mask 5B is patterned. This resist mask 5B is set to allow the P channel element formation region to be exposed while covering the N channel element formation region. Then, phosphorous (P) is ion-implanted upon using this resist mask 5B thereby forming a N well 9.

Subsequently, as shown in FIG. 7C, phosphorous (P) is ion-implanted to form a P channel stop layer 10. Further, ion-implantation of boron (B) for $V_{th}$ control is made through the gate polysilicon electrode 4 and the oxide film 3A, 3B thereby forming a $V_{th}$ control layer 11 as shown in FIG. 8A. It will be understood that the above three ion implantations for forming the N well 9, the P channel stop layer 10 and the $V_{th}$ control layer 11 may be made before the formation of the gate polysilicon electrode 4.

Next, after removing the resist mask 5B, a resist mask 5C is newly patterned to accomplish a high concentration ion implantation to the source and the drain of the N channel element formation region and the N well contact formation region as shown in FIG. 8B. Then, arsenic (As) is ion-implanted upon using the resist mask 5C thereby forming a source 12A, a drain 12B and a connected layer 13 at the side of the N well 9 as shown in FIG. 8(B). In this ion implantation, the gate polysilicon electrode 4 and the LOCOS oxide films 2A, 2B serve as a mask for ion implantation in the N channel formation region, while the LOCOS oxide films 2A, 2B surrounding the oxide film 3B serve as a mask for ion implantation in the N well contact region.

Subsequently, after the resist mask 5C is stripped, a resist mask 5D is patterned to accomplish a high concentration ion implantation to the source and the drain of the P channel element formation region and the P well contact formation region of the P well 6 as shown in FIG. 8C. Boron difluoride is ion-implanted in high concentration upon using the resist mask 5D thereby forming a source 14A and a drain 14B in the P channel element formation region and a connected layer 15 in the P well contact formation region. In this ion implantation, the gate polysilicon electrode 4 and the LOCOS oxide films 2A, 2B serve as a mask for the ion implantation in the P channel element formation region, while the LOCOS oxide films 2A, 2B surrounding the oxide film 3B serve as a mask for the ion implantation in the P well contact formation region.

Thus, as discussed above, in the semiconductor device production method, the resist masks 5A, 5B, 5C and 5D are required to be patterned in order to form a variety of impurity diffusion layers in the N channel element formation region and the P channel element formation region.

Now, in connection with semiconductor device production methods, a so-called oblique ion implantation has been proposed as disclosed in Japanese Patent Provisional Publications No. 5-6902 and 2-306624. The invention disclosed in Japanese Patent Provisional Publication No. 5-6902 is arranged such that resist masks having different widths are patterned through a clearance, upon which an oblique ion implantation is made in order to make a source and a drain as an asymmetrical impurity layer. The invention disclosed in Japanese Patent Provisional Publication No. 2-306624 is arranged such that an oblique ion implantation is made onto the inner wall surface of a connection opening for wiring which opening is formed in an insulated film thereby to damage the inner wall surface. A resultant damaged portion is intended to serve as an adsorption point for tungsten (W) in case of growing tungsten by using a CVD method.

However, drawbacks have been encountered in the above discussed semiconductor production methods. In the conventional production method as shown in FIGS. 6A to 8C, a common resist mask is used to accomplish the ion implantation for forming the well, the ion implantation for forming the channel stop layer and the ion implantation for forming the $V_{th}$ control layer, and therefore the number of steps for forming masks can be largely reduced. However, at least the ion implantation for forming the source and the drain is required to be accomplished upon using a resist mask which is different from that for the above ion implantations. Accordingly, in the process of forming a CMOS IC as discussed above, steps for forming at least four resist masks 5A, 5B, 5C, 5D are necessary to form the well, the channel stop layer, the $V_{th}$ control layer, the source drain, the well contact layer and the like.

In the invention disclosed in Japanese Patent Provisional Publication No. 5-6902, steps for forming a plurality of resist masks are necessary in a process for forming the source and the drain, so that a large number of masks are necessary for production of a CMOS IC. Additionally, the invention disclosed in Japanese Patent Provisional Publication No. 2-306624 is arranged to accomplish an ion implantation of argon (Ar) onto the: inner wall surface of the wiring connection opening and therefore is not arranged to form an impurity diffusion layer as a layer to be wired, at the bottom section of the connection opening for wiring. This does not serve to reduce the number of steps for forming resist masks.

SUMMARY OF THE INVENTION

It is an object of the present invention to provide an improved production method of a semiconductor device, which can overcome drawbacks encountered in similar production methods of a semiconductor device.

Another object of the present invention is to provide an improved production method of a semiconductor device, which can simplifying a production process of the semiconductor device.

A further object of the present invention is to provide an improved production method of a semiconductor device, which can increase kinds of impurity diffusion layers to be formed upon using a common resist mask thereby to reduce the number of steps for forming resist masks.

An aspect of the present invention resides in a method of producing a semiconductor device, comprising the following steps: (1) providing a pattered resist mask over a semiconductor substrate, the resist mask being formed with a first opening portion having a first aspect ratio, and a second opening portion having a second aspect ratio larger than the first aspect ratio; (2) forming an impurity diffusion layer by an oblique ion-implantation of impurity ion into a surface of the semiconductor substrate through the second opening portion at an implantation angle to prevent the impurity ion from reaching a bottom surface of the first opening portion; and (3) ion-implanting impurity ion from at a substantially vertical angle to the semiconductor substrate by using the resist mask.

Another aspect of the present invention resides in a method of producing a semiconductor device having a first region including a first conductivity type MOS transistor, a second region including a second conductivity type MOS transistor, and first and second connecting sections for potential fixture which are respectively formed at a part of the first region and a part of the second region. The semiconductor device producing method comprises the following steps: (1) providing a first resist mask over a part where the first connecting section of the first region and the second region of the semiconductor substrate, the first resist mask being formed with a first opening portion to allow the second connecting section of the second region; (2) forming an impurity diffusion layer other than source and drain regions in the first region by an oblique ion implantation of impurity ion into a surface of the semiconductor substrate at an implantation angle to prevent the impurity ion from reaching a bottom surface of the first opening portion by using a first resist mask; (3) forming the source and drain regions in the first region and the second connecting section in the second region by substantially vertically ion-implanting impurity ion to the semiconductor substrate by using the first resist mask; (4) removing the first resist mask; (5) forming a second resist mask over the second connecting section in the second region and the first region, the second resist mask being formed with a second opening portion to expose a part where the first connecting section of the first region is to be formed; (6) forming an impurity diffusion layer other than source and drain regions in the second region by an oblique ion implantation of impurity ion into the surface of the semiconductor substrate at an implantation angle to prevent the impurity ion from reaching a bottom surface of the second opening portion by using the second resist mask; and (7) forming source and drain regions in the second region and a first connecting section: in the first region by substantially vertically ion-implanting impurity into the surface of the semiconductor substrate by using the second mask.

According to the semiconductor device producing method of the present invention, by virtue of the oblique ion-implantation in which the impurity ion cannot reach the bottom surface of the small opening portion, only ion-implantation to the inside of the large opening portion can be accomplished. Accordingly, it is possible to make a plurality of ion implantations in different manners even upon using only a resist mask in case that kinds of ion to be ion-implanted are different between the large and small opening portions or in case that ion-implantation conditions are different between the large and small opening portions. By the generally vertical ion implantation relative to the substrate, common impurity ions can be implanted into the large and small opening portions. As a result, in case of, for example, forming the diffusion layer for taking out bit of the memory cell, in the semiconductor substrate, ion implantation of, for example, arsenic (As) in a high concentration of about $5E15$ $cm^{-2}$ is obliquely accomplished in the large opening portion which has been formed in a part of the semiconductor substrate corresponding to the diffusion layer, while the ion implantation cannot be made in a part where the diffusion layer connected to the storage node side of the stacked capacitor is formed, the part corresponding to the small opening portion. Thereafter, the low concentration (for example, about $1E14$ $cm^{-2}$) ion implantation of phosphorous (P) suitable for preventing production of crystal defect and reducing junction leak can be carried out under the generally vertical ion implantation.

Additionally, for example, in a CMOS IC or the like which is formed with the first region including the first conductivity type MOS transistor and the second region including the second conductivity type MOS transistor, the source and drain, the well contact section, the potential fixture connected section (impurity diffusion layer) as a substrate contact section or the like are of the high concentration impurity region, while providing the well, the channel stop layer, the Vth control layer and the like which are low in concentration as compared with the high concentration impurity region. This invention makes it possible to form the connected section in a predetermined region, the low concentration impurity diffusion layer (for example, the well, the channel stop layer and the like) in another region, and the high concentration impurity diffusion layer (for example, the source and drain) by using only the first and second (two) resist masks, thereby reducing the number of mask forming steps.

Thus, according to the present invention, the number of steps for forming masks required to form impurity diffusion layers can be reduced thereby simplifying or facilitating a process of producing a semiconductor device. This improves a throughput and lowers a production cost of a semiconductor device while reducing occurrence of a mask slippage during production of the semiconductor device.

DETAILED DESCRIPTION OF THE INVENTION

Referring now to FIGS. 1A to 3C, an embodiment of a method of producing a semiconductor device, according to the present invention is illustrated. The producing method of this embodiment is for a CMOS IC.

Figure 1A:
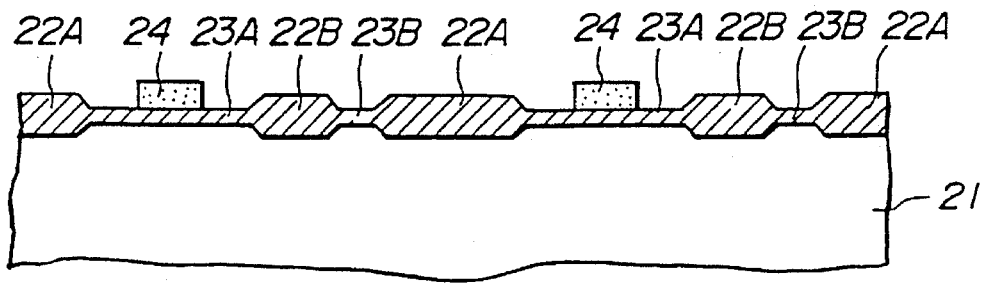
FIGS. 1A to 1C, 2A to 2C and 3A to 3C are fragmentary sectional views showing successive steps in a method of producing a semiconductor device, in connection with an embodiment of the present invention.

In this embodiment, as shown in FIG. 1A, LOCOS oxide films 22A, 22B are formed at the surface of a N type silicon substrate 21 by using a known selective oxidation technique. The LOCOS oxide films 22A, 22B are set to have a film thickness of, for example, 400 nm and a width which is larger in the LOCOS oxidation film than in the LOCOS oxide film 22B. Thereafter, oxide films 23A, 23B having a thickness of, for example, about 16 nm is formed at the surface of the silicon substrate 21. Then, a polysilicon film doped with phosphorus (P) is formed at the whole surface to have a thickness of, for example, 300 nm, and then a gate polysilicon electrode 24 is formed on the (gate) oxide film 23A by using a photolithography technique or a dry etching technique.

Figure 1B:
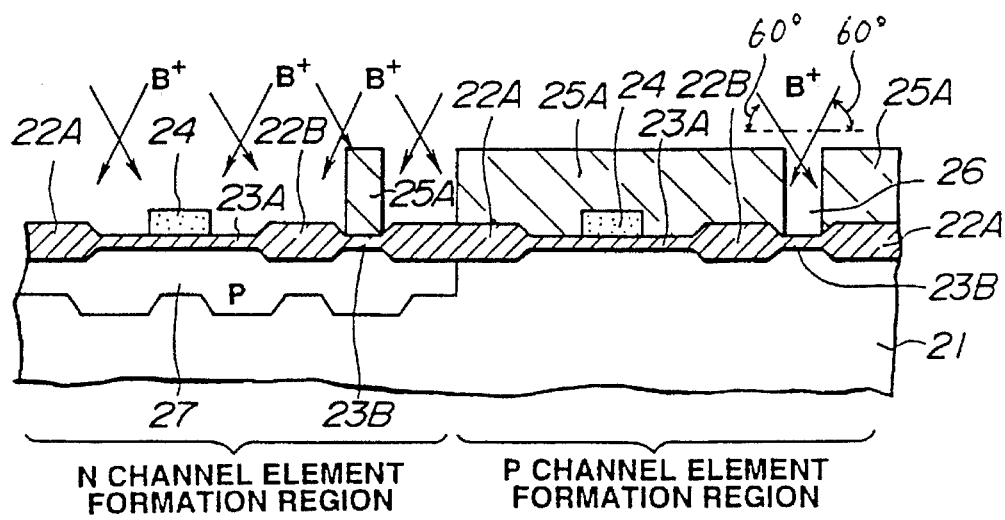

Subsequently, as shown in FIG. 1B, a first resist mask 25A is patterned. The first resist mask 25A is formed to have a pattern which allows sections other than the oxide film 23B in a N channel element formation region to be exposed while allowing only the oxide film 23B in a P channel element formation region to be exposed. It is to be noted that an opening portion 26 of the resist mask for allowing the oxide film 23B in the P channel element formation region has an aspect ratio (a ratio between the diameter of the opening portion and the film thickness of the resist mask) larger than 1/tan 30°. Additionally, an opening portion of the resist mask for exposing the N channel element formation region has an aspect ratio smaller than that of the opening portion 26 for exposing the P channel element formation region. An impurity diffusion layer as a connected section will be formed at a step accomplished hereinafter, in the silicon substrate 21 below the opening portion 26 and at a portion where the resist mask is formed in the N channel element formation region.

Next, under using the first resist mask 25A, an oblique ion implantation of boron (B) is accomplished to the silicon substrate 21 at an implantation (incident) angle of 60° relative to the silicon substrate 21 (in a direction inclined 30° relative to a vertical direction which is vertical to the silicon substrate 21) while rotating the silicon substrate (wafer) 21 at a rotational speed of 60 r.p.m. thereby forming a P well 27 throughout the whole of the N channel element formation region. Under the action of this oblique ion implantation, boron ion is implanted to the silicon substrate 21 through the LOCOS oxide films 22A, 22B and the polysilicon electrode 24. It is to be noted that, at this ion implantation, boron ion is prevented from reaching the bottom surface of the opening portion 26 in the P channel element formation region because the implantation angle is 60°, so that no impurity diffusion layer is formed in the P channel element formation region.

Figure 1C:
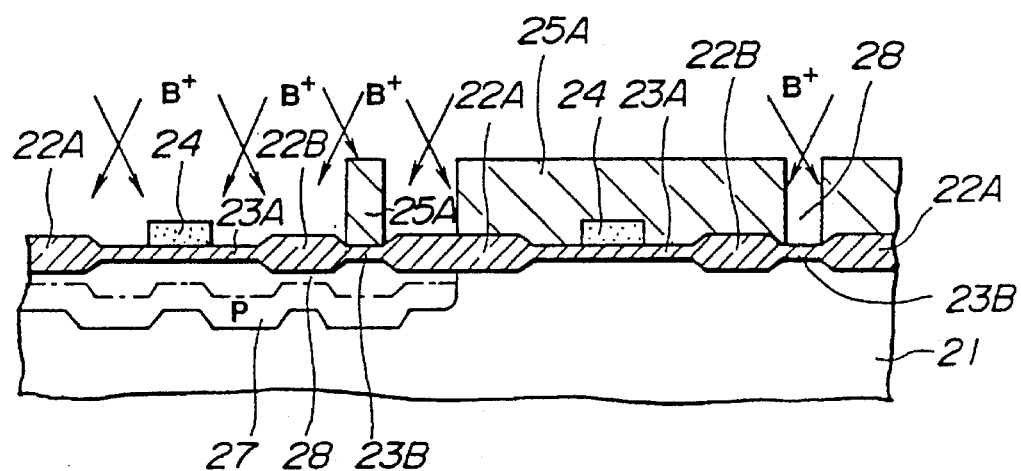

Subsequently, as shown in FIG. 1C, upon using the first resist mask 25A as it is, an oblique ion implantation of boron (B) is similarly accomplished thereby forming a N channel stop layer 28. Also in this ion implantation, boron ion is implanted to the silicon substrate 21 through the LOCOS oxide films 22A, 22B and the gate polysilicon electrode 24. It is to be noted that the ion implantations for forming the P well 27 and the N channel element stop layer 28 is accomplished under a condition for covering, with the resist mask, a portion over a section where the connected section of the N channel element formation region is formed; however, impurity introduction can be made with no problem because of ion implantation made in an inclined direction.

Figure 2A:
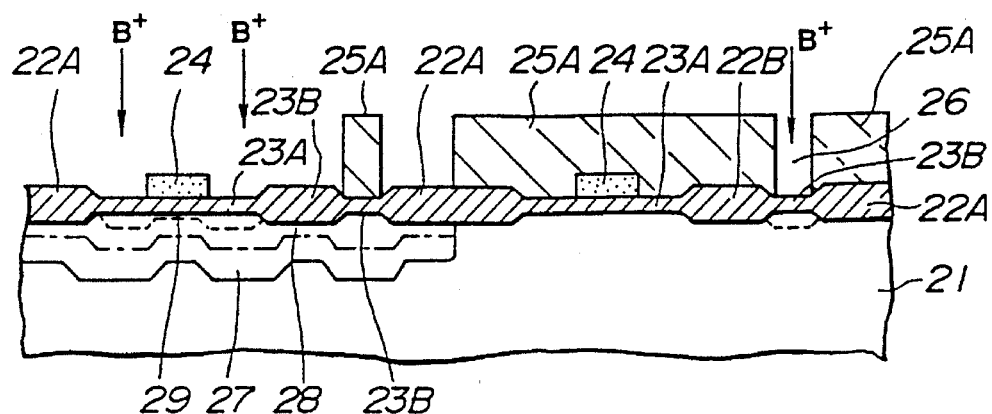
Figure 2B:
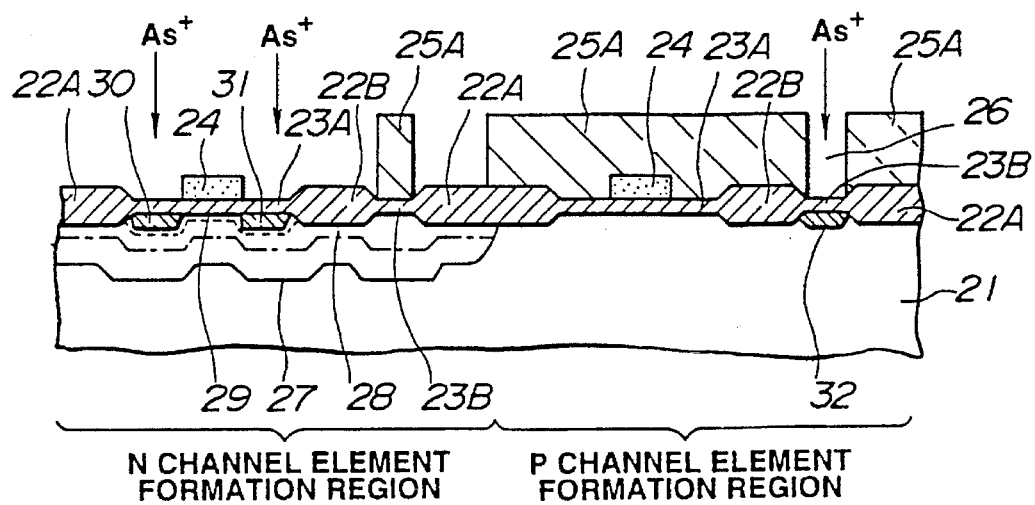

Next, as shown in FIG. 2A, upon using the first resist mask 25A, boron (B) is ion-implanted vertically in a low concentration thereby forming a $V_{th}$ control layer 29 of a MOS transistor. Subsequently, upon using the first resist mask 25A as it is, arsenic (As) is vertically ion-implanted in a high concentration thereby forming a source 30 and a drain 31 in the N channel element formation region while forming a connected section 32 formed of a high concentration N type impurity diffusion layer at the surface portion of the silicon substrate 21 in the P channel element formation region as shown in FIG. 2B. The formation of the connected section 32 is made under the ion implantation through the opening portion 26 of the first resist mask 25A. It is to be noted that although boron (B) has been implanted in the low concentration to the connected section 32 at the step made hereinbefore, arsenic (As) is implanted in the high concentration at this step and therefore the connected section 32 serves as a high concentration N type layer.

Figure 2C:
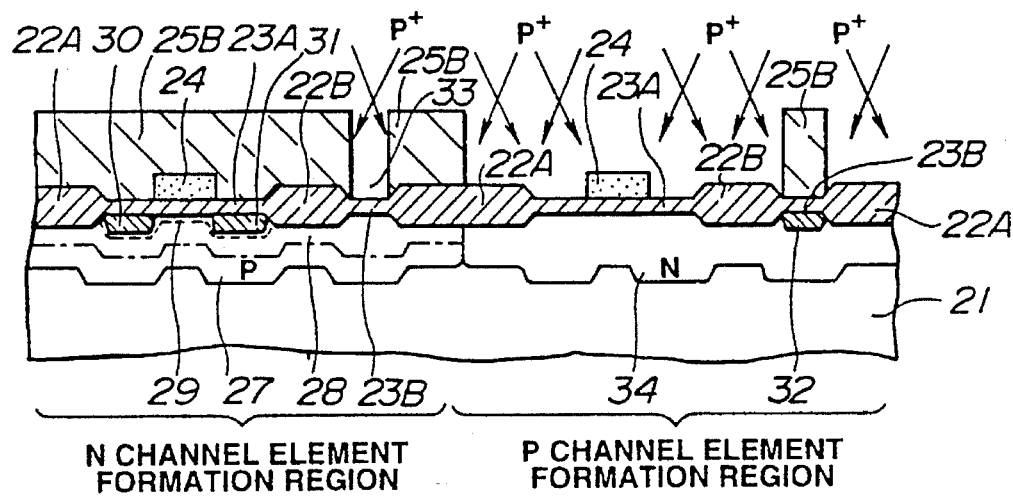

Thus, hereinbefore a plurality of ion implantations have been carried out upon using the common first resist mask 25A. Next, after removing the first resist mask 25A, a second resist mask 25B is newly patterned as shown in FIG. 2C. This second resist mask 25B has a pattern which is reverse to that of the first resist mask 25A. More specifically, as shown in FIG. 2C, the second resist mask 25B covers the almost whole surface of the N channel element formation region while having an opening portion 33 which allowing the oxide film 23B of a portion where the connected section is formed, to be exposed. Further, a part of the second resist mask 25B is formed only on the oxide film 23B covering the connected section 32 in the P channel element formation region. It is to be noted that the opening portion 33 has an aspect ratio larger than 1/tan 30° similarly to the opening portion 26 in the first resist mask 25A.

Subsequently, upon using the second resist mask 25, an oblique ion implantation of phosphorous (P) is accomplished to the silicon substrate 21 at an implantation (incident) angle of 60° (a direction inclined 30° relative to a vertical direction which is vertical to the silicon substrate 21) while rotating the silicon substrate (wafer) 21 at a rotational angle of 60 r.p.m. as shown in FIG. 2C. As a result of this oblique ion implantation, phosphorous is implanted into the silicon substrate 21 through the LOCOS oxide films 22A, 22B and the gate polysilicon electrode 24 thereby forming a N well 34 as shown in FIG. 2C. It is to be noted that although a part of the resist mask is formed columnar over the connected section 32, impurity introduction can be accomplished with no problem because there is a large exposed area in the N channel element formation region, implanting phosphorous ion obliquely or in the inclined direction. Additionally, in the opening portion 33, ion is prevented from introduction upon striking the wall surface of the resist mask so as not to reach the bottom surface of the opening portion 33 because the aspect ratio of the opening portion 33 is larger than 1/tan 30°.

Figure 3A:
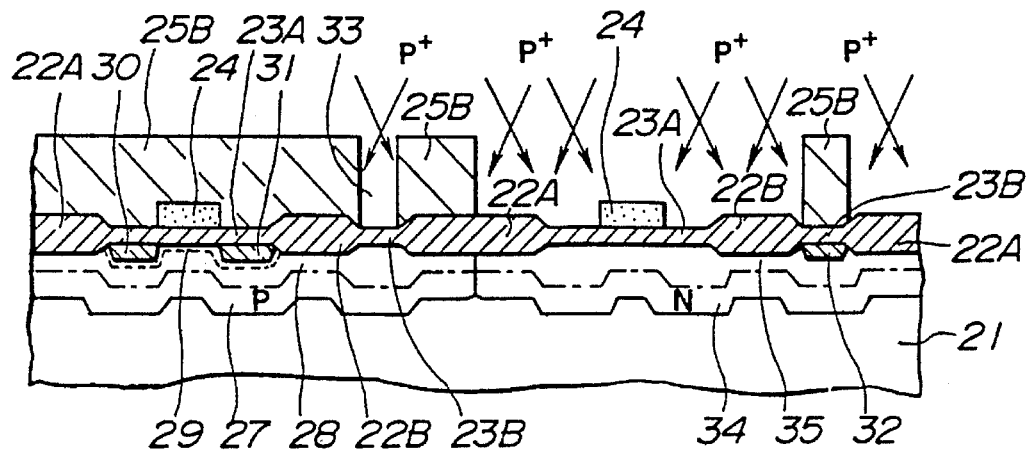

Next, as shown in FIG. 3A, upon using the second resist mask 25B, an oblique ion implantation of phosphorous (P) is carried out thereby to form a P channel stop layer 35. The implantation angle and the rotational speed of the silicon substrate 21 in this ion implantation are the same as those in the oblique ion implantation for formation of the N well 34.

Figure 3B:
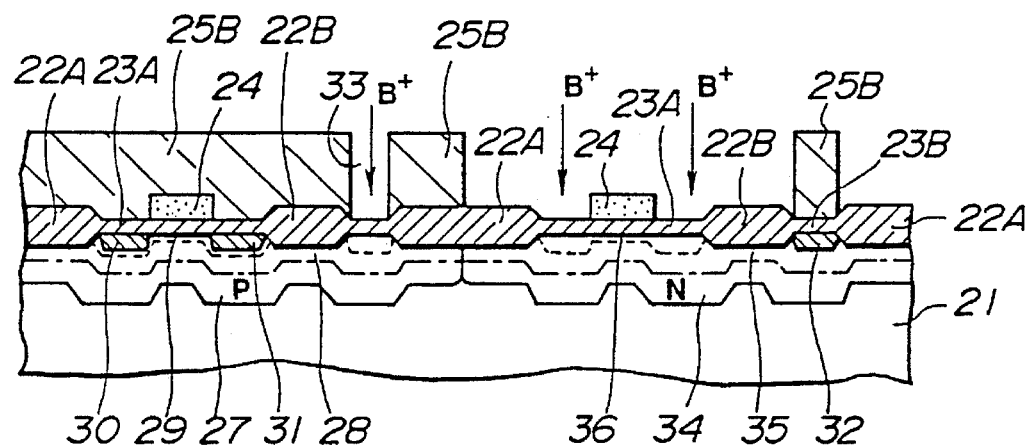

Then, upon using the second resist mask 25B, boron (B) is vertically ion-implanted in a low concentration thus controlling $V_{th}$ of a PMOS transistor. As a result, a $V_{th}$ control layer 36 is formed as shown in FIG. 3B.

Figure 3C:
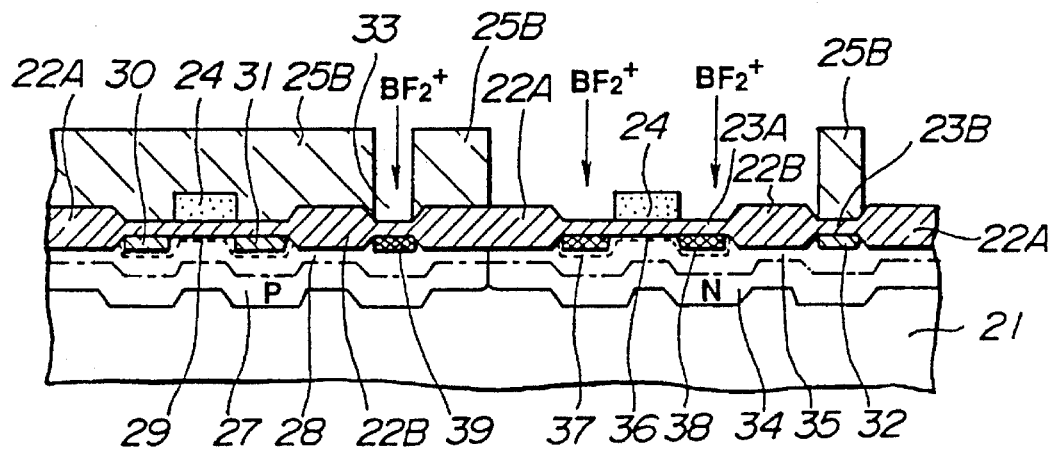

Furthermore, as shown in FIG. 3C, upon using the second resist mask 25B, boron difluoride(BF$_2$) is vertically ion-implanted thereby forming sources 37, 38 and a connected section 39 of the N channel element formation region. At this time, the LOCOS oxide films 22A, 22B and the gate polysilicon electrode 24 serve as a mask for ion implantation in the P channel element formation region, and therefore the source 37 and the drain 38 are respectively formed on the opposite sides of the gate polysilicon electrode 24. The connected section 39 is formed through the opening portion 33 because ion beam in the ion implantation is vertical to the N-type silicon substrate 21. It is to be noted that although the low concentration boron has been implanted to the connected section 39 at the previous step, the high concentration BF$_2$ is implanted to the connected section 39 at this step, and therefore the connected section 39 becomes a high concentration P type impurity layer to serve as a suitable contact section.

According to the above production method, it is sufficient to use only two masks (the first and second resist masks 25A, 25B ) in case of forming the P well 27, the N channel stop layer 28, the $V_{th}$ control layer 29 and the connected section 39 in the N channel element formation region while forming the N well 34, the P channel stop layer 35, the $V_{th}$ control layer 36 and the connected section 32. This largely reduces the number of steps for forming masks.

It will be understood that a step for forming a LDD (Lightly deped drain) may be added to the steps for forming the source and the drain.

While the above-discussed production method has been shown and descried as being applied to the CMOS IC in which the N wells 21 and the well contacts are formed in the N type silicon substrate, it will be understood that the principle of the invention may be applied to production of a variety of semiconductor devices.

Figure 4:
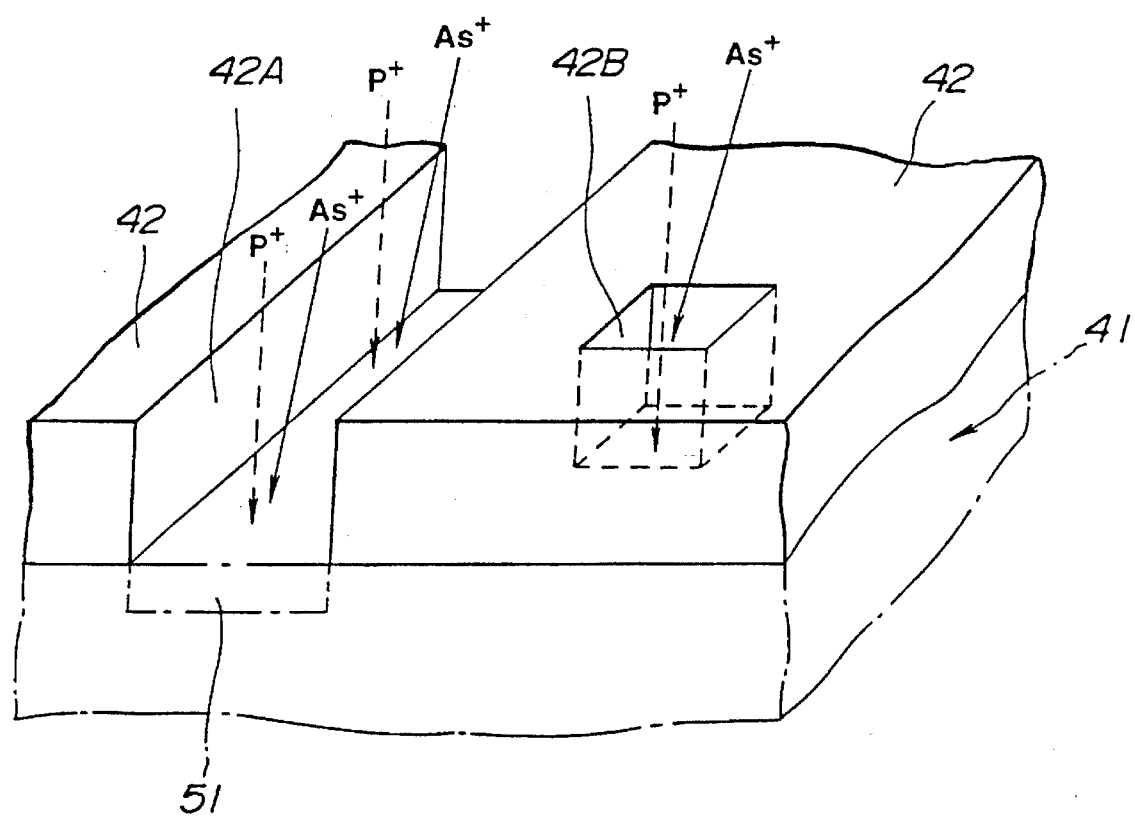
FIG. 4 is a fragmentary perspective view of a resist mask used in a method of producing a semiconductor device, in connection with another embodiment of the present invention.
Figure 5A:
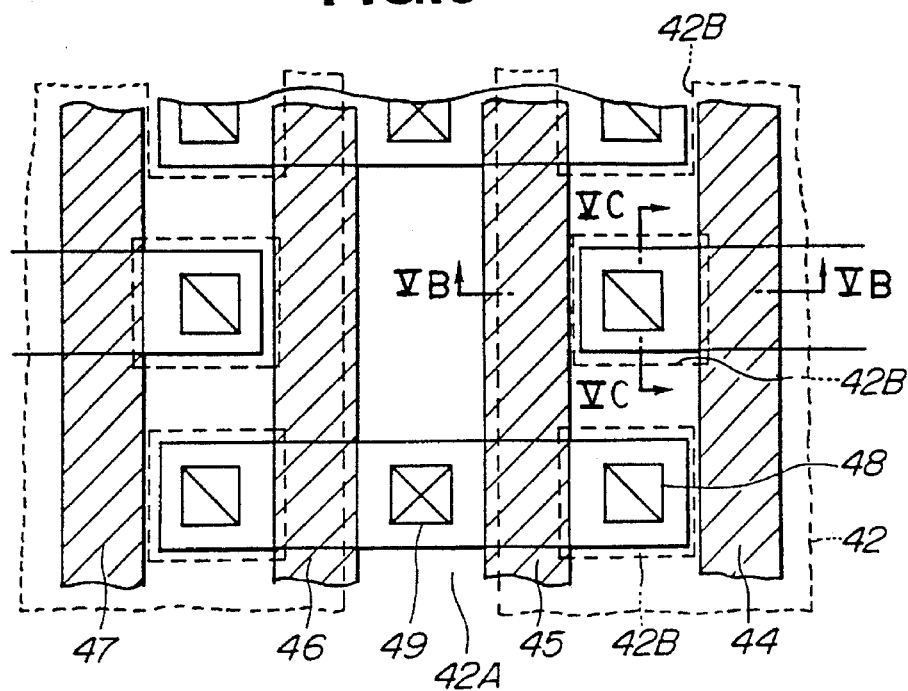
FIG. 5A is a plan view showing the producing method of the semiconductor device upon using the resist mask of FIG. 4.

FIGS. 4 and 5A to 5C illustrate another embodiment of the semiconductor device production method according to the present invention, which is similar to the production methods of FIGS. 1A to 3C. In the production method of FIGS. 4 to 5C, the principle of the present invention is applied to a production method of a DRAM. FIG. 4 schematically shows a part of a resist mask 42 which is used in this production method and patterned on the silicon substrate 41. The resist mask 42 is formed with a groove-like large opening portion 42A, and a small opening portion 42B in the form of a hole having a rectangular cross-section. In FIG. 4, LOCOS oxide films and word lines are omitted. FIG. 5A is a plan view of the resist mask and shows the locational relationship between the arrangement of word lines 44 to 47 and the resist mask 42. The small opening portion 42B has an aspect ratio which is not more than 1/tan 30° both in a cross-section represented by a line A—A and a cross-section represented by a line B—B. This aspect ratio is determined by suitably setting the diametrical dimension of the small opening portion 42B and the film thickness of the resist mask 42. The aspect ratio of the large opening portion 42A is relatively small in a cross-section parallel with a width direction of the opening portion 42A but relatively large in a cross-section parallel with a longitudinal direction of the opening portion 42A since the large opening portion 42 is formed long and groove-like. The aspect ratios of the large opening portion 42A are larger than the small opening portion 42B. Additionally, as shown in FIG. 5A, the resist mask 42 is patterned in such a manner that the large opening portion 42A allows a section between the word lines 45, 46 to be exposed while the small opening portion 42B allows the position of a storage node contact section where a stacked capacitor is disposed, to be exposed.

The production method of this embodiment will be discussed.

Figure 5B:
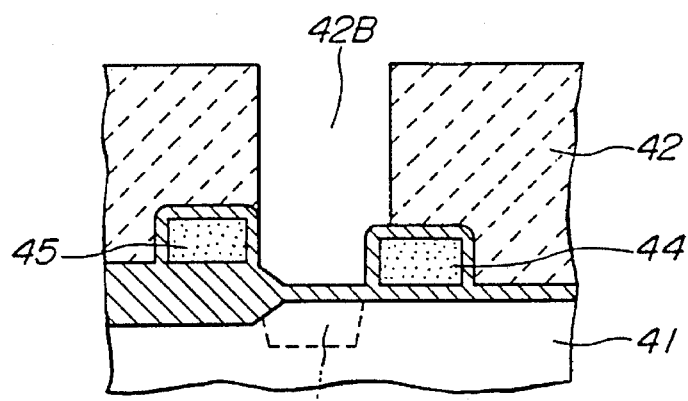
FIG. 5B is a vertical sectional view taken in the direction of arrows substantially along the line $V_B$—$V_B$ of FIG. 5.
Figure 5C:
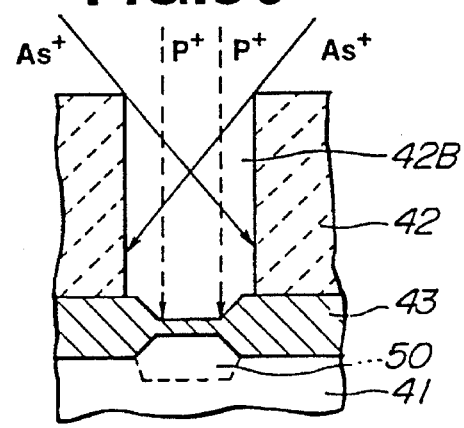
FIG. 5C is a vertical sectional view taken in the direction of arrows substantially along the line $V_C$—$V_C$ of FIG. 5A.
Figure 6A:
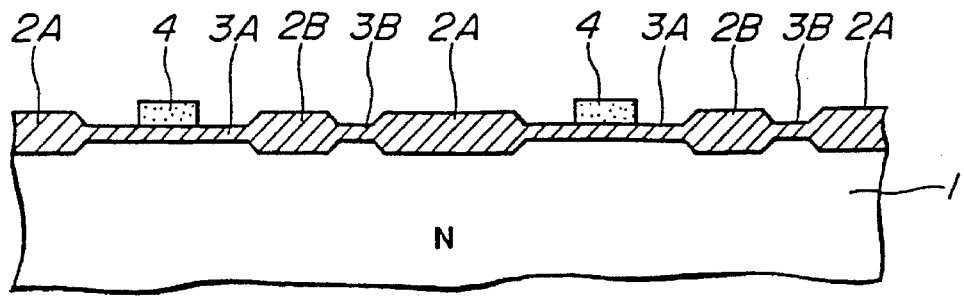
FIGS. 6A to 6C, 7A to 7C and 8A to 8C are fragmentary sectional views showing successive steps in a conventional method of producing a semiconductor device.
Figure 6B:
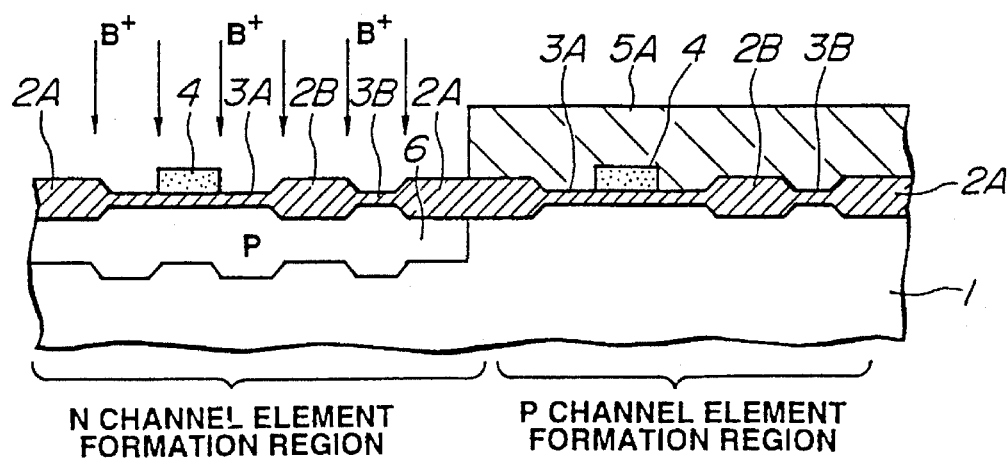
Figure 6C:
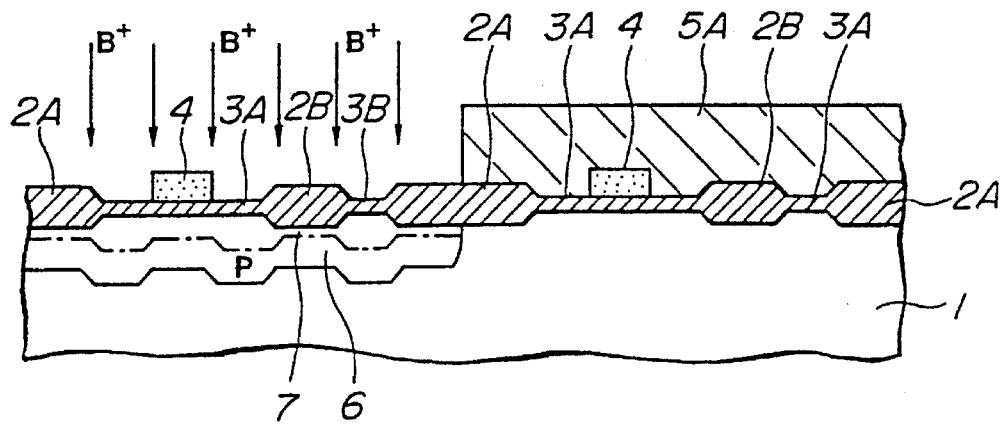
Figure 7A:
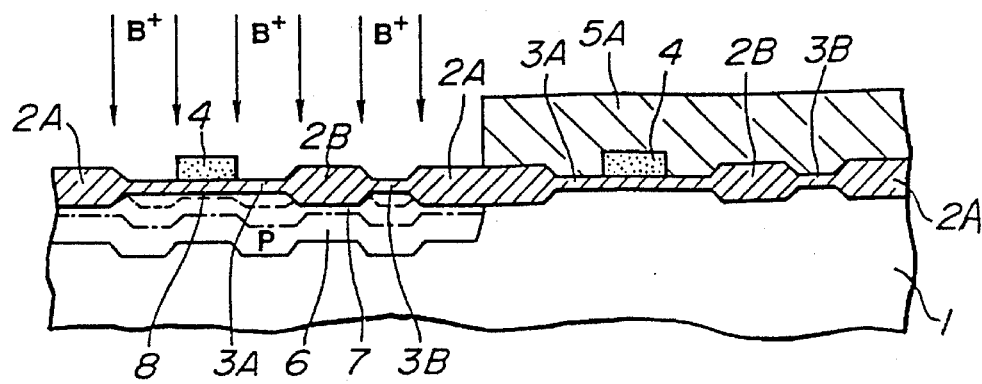
Figure 7B:
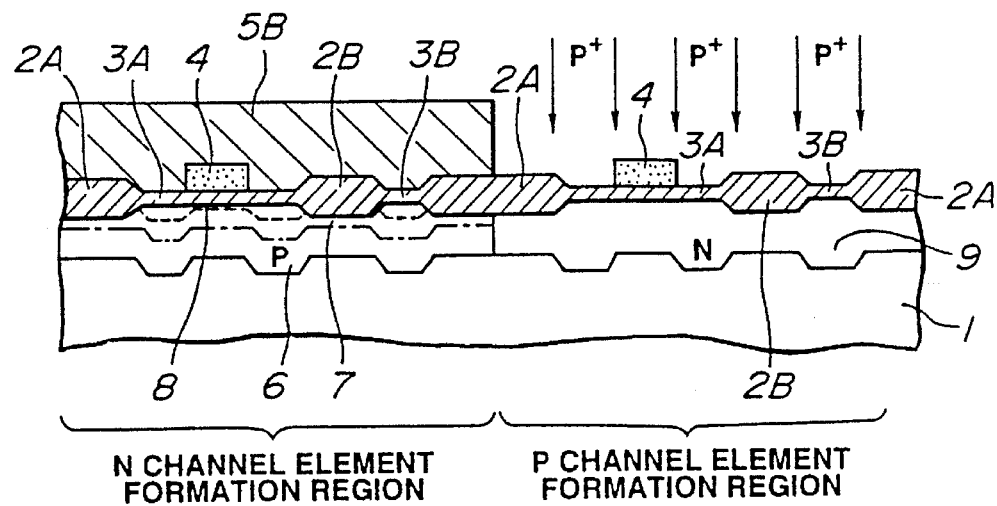
Figure 7C:
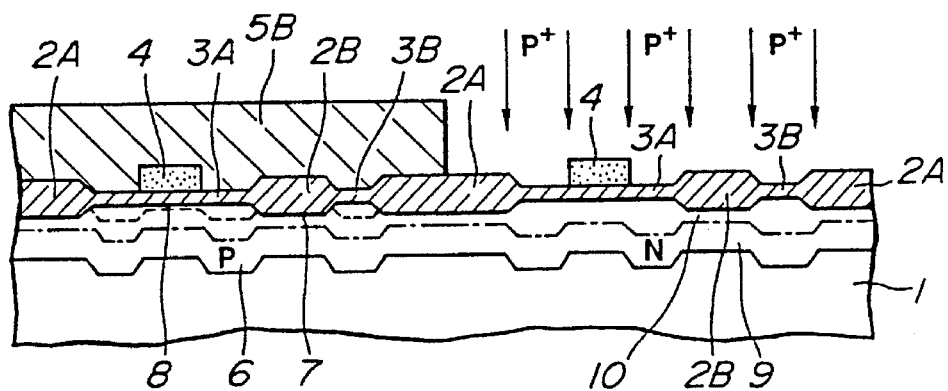
Figure 8A:
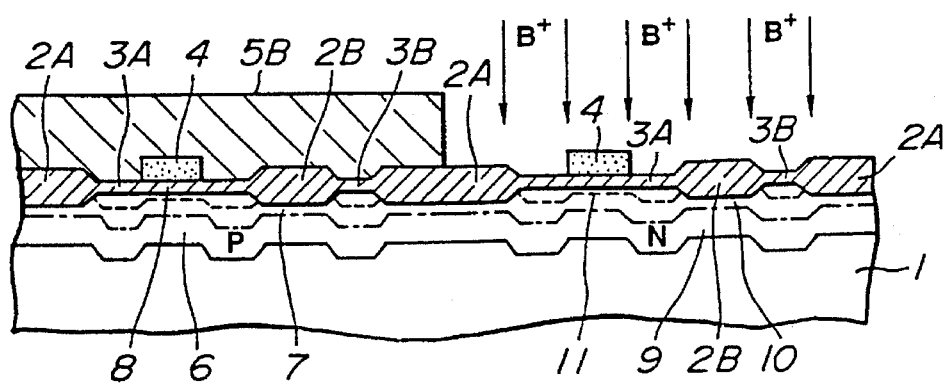
Figure 8B:
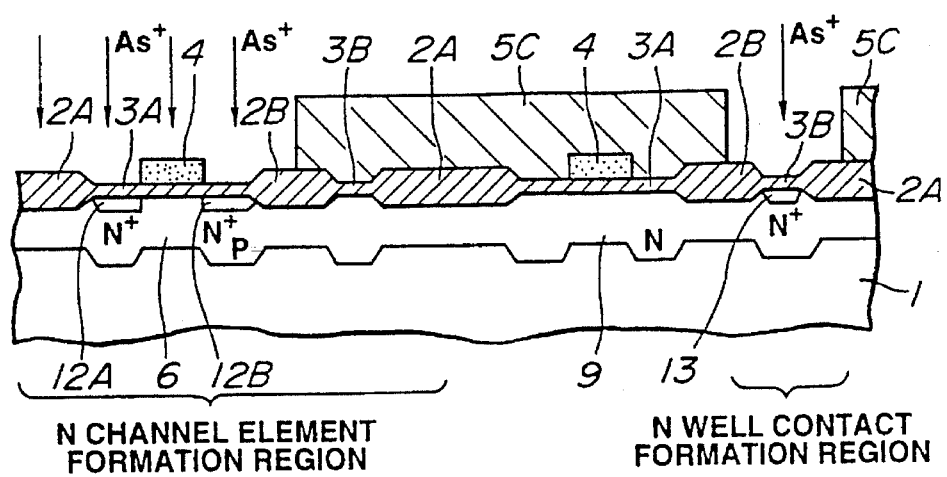
Figure 8C:
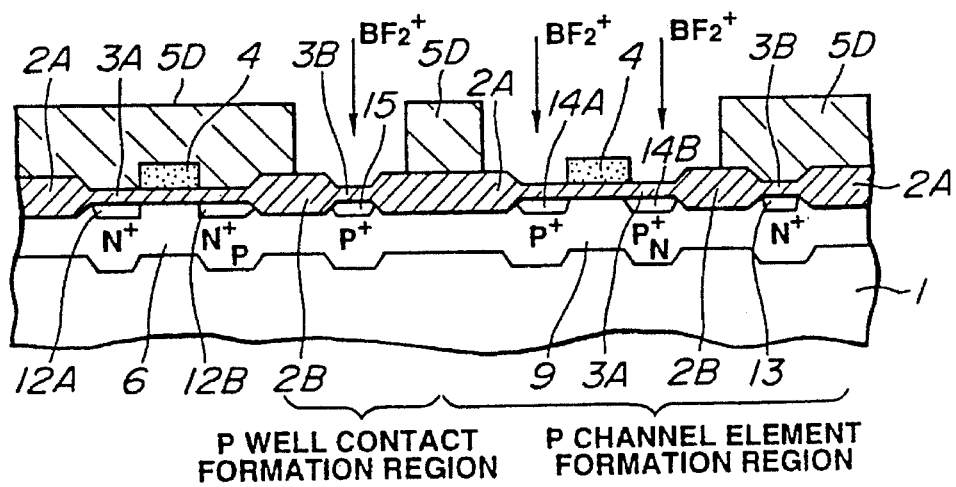

After a source and a drain are formed by ion implantation upon using the above-mentioned resist mask 42, an oblique ion implantation of about 5E15 cm$^{-2}$ of arsenic (As) is accomplished under irradiation of beam along the longitudinal direction of the large opening portion 42A at the implantation (incident) angle of 60° relative to the silicon substrate 41 (in a direction inclined 30° relative to a vertical direction which is vertical to the silicon substrate 41) in a condition where the substrate 41 is fixed as shown in FIG. 4 thereby forming a high concentration impurity region 51 for a bit contact, only at the bottom portion of the large opening portion 42A. While the irradiation of ion has been shown and described as being made only in one direction in this production method, it will be understood that irradiation of ion may be made in ,two directions (at the implantation angle of 60°) which cross each other. Since the ion implantation in this step is made in the oblique direction relative to the silicon substrate, ion cannot reach the bottom surface portion (at the side of the storage node) of the small opening portion 42B having the aspect ratio not smaller than 1/tan 30° so that no impurity diffusion layer is formed, as shown in FIG. 5C which is a cross-sectional view taken in the direction of arrows substantially along the line $V_C$—$V_C$ of FIG. 5A. FIG. 5B is a cross-sectional view taken in the direction of arrows substantially along the line $V_B$—$V_B$ of FIG. 5A.

Subsequently, as shown in Film 4, upon using the same resist mask 42, an ion implantation of phosphorous (P) is vertically made in a low concentration of about 1E14 cm$^{-2}$. As a result, as shown in FIG. 5C, a low concentration impurity region 50 is formed in the silicon substrate 41 at a position below the bottom of the small opening portion 42B and located at the storage node side. It is to be noted that the low concentration ion implantation of phosphorous of about 1E14 cm$^{-2}$ is particularly required to be made to the diffusion layer on the storage node side for the purpose: of suppressing production of crystal defect to reduce a junction leak. In this regard, according to this production method, the high concentration impurity diffusion layer 51 and the low concentration impurity diffusion layer 50 can be formed upon using the common mask without changing resist masks, i.e., upon using only one mask formation step. It is to be noted that although phosphorous (P) at a low concentration is added to arsenic (As) at a high concentration in the high concentration impurity diffusion layer 51 which is at the bit contact side, there is no effect to the characteristics of the semiconductor device.

While the principle of the present invention has been discussed on only two embodiments or semiconductor device production methods, it will be appreciated that it may be applied to other production methods for semiconductor devices, and, for example, to production methods for semiconductor devices formed with diffusion layers which are relatively largely different in area and width dimension or the like and different in kind and concentration of impurity to be ion-implanted.

What is claimed is:

1. A method of producing a semiconductor device, comprising the following steps:

providing a patterned resist mask over a semiconductor substrate, said resist mask being formed with a first opening portion having a first aspect ratio, and a second opening portion having a second aspect ratio larger than said first aspect ratio, said second opening portion being an opening portion which defines an ion implanted region of a diffusion layer of a memory cell formed in said semiconductor substrate and said first opening portion being an opening portion which defines an ion implanted region of a diffusion layer to be connected to a storage node side of a stacked capacitor;

forming an impurity diffusion layer by an oblique ion-implantation of impurity ion into a surface of said semiconductor substrate through said second opening portion at an implantation angle to prevent the impurity ion from reaching a bottom surface of said first opening portion; and then ion-implanting impurity ion at a substantially vertical angle to said semiconductor substrate by using said resist mask.

2. A method as claimed in claim 1, wherein said first opening portion is a slit-like opening portion which defines an ion implanted region of a diffusion layer for taking out bit of a memory cell formed in said semiconductor substrate.

3. A method as claimed in claim 1, wherein impurity diffusion layer having concentration of about 5E15 cm$^{-2}$ at a surface of said semiconductor substrate is formed by said oblique ion implantation and ion-implanting.

4. A method as claimed in claim 1, wherein impurity diffusion layer having concentration of about 1E14 cm$^{-2}$ at a surface of said semiconductor substrate is formed by said ion-implanting step.

5. A method as claimed in claim 1, wherein said oblique ion-implanting step is conducted by fixing said semiconductor substrate during said forming step.

6. A method as claimed in claim 1, wherein said oblique ion-implanting step is conducted by rotating said semiconductor substrate during said forming step.

7. A method of producing a semiconductor device having a first region including a first conductivity type MOS transistor, a second region including a second conductivity type MOS transistor, and first and second connecting sections for potential fixture which are respectively formed at a part of said first region and a part of said second region, said method comprising the following steps:

providing a first resist mask over the first connecting section of said first region and said second region of said semiconductor substrate, said first resist mask being formed with a first opening portion to allow the second connecting section of said second region;

forming an impurity diffusion layer other than source and drain regions in said first region by an oblique ion implantation of impurity ion into a surface of said semiconductor substrate at an implantation angle to prevent the impurity ion from reaching a bottom surface of said first opening portion upon using a first resist mask;

forming the source and drain regions in said first region and the second connecting section in said second region by substantially vertically ion-implanting impurity ion to said semiconductor substrate by using said first resist mask;

removing said first resist mask;

forming a second resist mask over the second connecting section in said second region and said first region, said second resist mask being formed with a second opening: portion to expose a part where the first connecting section of said first region is to be formed;

forming an impurity diffusion layer other than source and drain regions in said second region by an oblique ion implantation of impurity ion into the surface of said semiconductor substrate at an implantation angle to prevent the impurity ion from reaching a bottom surface of said second opening portion by using said second resist mask; and forming source and drain regions in said second region and a first connecting section in said first region by substantially vertically ion-implanting impurity into the surface of said semiconductor substrate by using said second mask.

8. A method as claimed in claim 7, wherein said impurity diffusion layer is a well region.

9. A method as claimed in claim 7, wherein said impurity diffusion layer is a channel stop layer.

* * * * *